United States Patent
Leibiger et al.

(10) Patent No.: US 7,795,671 B2
(45) Date of Patent: Sep. 14, 2010

(54) PN JUNCTION AND MOS CAPACITOR HYBRID RESURF TRANSISTOR

(75) Inventors: Steven Leibiger, Falmouth, ME (US); Gary Dolny, Mountain Top, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 242 days.

(21) Appl. No.: 11/619,671

(22) Filed: Jan. 4, 2007

(65) Prior Publication Data
US 2008/0164506 A1    Jul. 10, 2008

(51) Int. Cl.
  *H01L 27/108* (2006.01)
(52) U.S. Cl. .............................. 257/330; 257/E27.092; 438/243
(58) Field of Classification Search ................. 257/330, 257/E27.092; 438/243
See application file for complete search history.

(56) References Cited

U.S. PATENT DOCUMENTS

| | | | |
|---|---|---|---|
| 5,208,657 A | 5/1993 | Chatterjee et al. | |
| 5,216,275 A | 6/1993 | Chen | |
| 5,306,656 A | 4/1994 | Williams et al. | |
| 5,438,215 A | 8/1995 | Tihanyi | |
| 5,828,101 A | 10/1998 | Endo | |
| 6,097,063 A | 8/2000 | Fujihira | |
| 6,207,994 B1 | 3/2001 | Remennik et al. | |
| 6,528,849 B1 | 3/2003 | Khemka et al. | |
| 7,125,777 B2 | 10/2006 | Cai et al. | |
| 7,368,777 B2 * | 5/2008 | Kocon ........................ | 257/302 |
| 2003/0054598 A1 * | 3/2003 | Disney ......................... | 438/197 |
| 2005/0029558 A1 * | 2/2005 | Hatakeyama et al. ........ | 257/264 |
| 2005/0276093 A1 * | 12/2005 | Graham et al. .............. | 365/149 |

OTHER PUBLICATIONS

Liang, C. Young; Samudra, Ganesh S.; Oxide-Bypassed VDMOS (OBVDMOS): An Alternative to Superjunction High Voltage MOS Power Devices, IEEE Electron Devices Letters, vol. 22, No. 8, Aug. 2001, pp. 407-409.

* cited by examiner

*Primary Examiner*—Thao X Le
*Assistant Examiner*—Matthew Gordon
(74) *Attorney, Agent, or Firm*—Hiscock & Barclay, LLP

(57) ABSTRACT

A high voltage semiconductor device, such as a RESURF transistor, having improved properties, including reduced on state resistance. The device includes a semiconductor substrate; a source region and a drain region provided in the substrate; wherein the source region and the drain region are laterally spaced from each other; and a drift region in the substrate between the source region and the drain region. The drift region includes a structure having at least two spaced trench capacitors extending between the source region and the drain region; and further includes a stack having at least a first region of a first conductivity type, a second region of a second conductivity type, and a third region of the first conductivity type, wherein the stack extends between the source region and the drain region and between the at least first and second trench capacitors and in electrical connection to the first and second trench capacitors. When the device is in an on state, current flows between the source and drain regions through the second region of the second conductivity type; and, when the device is in an off/blocking state, the second conductivity region is depleted four ways into the first and third regions of the stack and into the first and second trench capacitors.

24 Claims, 19 Drawing Sheets

PN JUNCTION AND MOS CAPACITOR HYBRID RESURF TRANSISTOR

FIELD OF THE INVENTION

This invention relates in general to semiconductor devices and more particularly to high voltage REduced SURface Field (RESURE) transistor devices and methods of making such devices.

BACKGROUND OF THE INVENTION

Both vertical and lateral high voltage transistors are widely used in power applications. In the on state, it is desirable that the transistor have low on resistance to minimize conduction losses. In the off state, it is desirable that the transistor have a high breakdown or blocking voltage. Lateral RESURF transistors are lateral devices having a source and a drain laterally spaced from each other and having a drift region between the source and drain regions. In the on state, current flows between the source and drain through the drift region, while, in the off state, the drift region is depleted preventing current flow. In order to increase the performance characteristics of power transistors, U.S. Pat. No. 6,097,063, issued Aug. 1, 2000, inventor Fujihiro, and U.S. Pat. No. 6,207,994 B1, issued Mar. 27, 2001, inventors Rumennik et al., disclose the use in a lateral device of a drift region having alternating layers of semiconductive material of a first and second conductivity types (p/n). U.S. Pat. No. 5,216,275, issued Jan. 1, 1993, inventor Chen, and U.S. Pat. No. 5,438,215, issued Aug. 1, 1995, inventor Tihanyi, apply this concept to vertical devices. The following article is of interest in disclosing the use in a VDMOS device of metal-thick-oxide at the sidewalls of the drift region to either increase the blocking voltage or increase the background doping—"Oxide-Bypassed VDMOS (OBVDMOS0: An Alternative to Superjunction High Voltage MOS Power Devices", by Liang et al., IEEE Electron Devices Letters, Vol. 22. No. 8, Pages 407-409, August 2001. An advantage of the current invention relative to these technologies is the use of four sided rather than two sided depletion regions when in the voltage blocking state.

There is a constant need for transistors with both high blocking voltage and ever lower on state resistance. The present invention addresses this need.

SUMMARY OF THE INVENTION

According to the present invention there is provided a solution to the needs discussed above.

According to a feature of the present invention, there is provided
a semiconductor device comprising:
a semiconductor substrate;
a source region and a drain region provided in said substrate; wherein said source region and said drain region are laterally spaced from each other;
a drift region in said substrate between said source region and said drain region;
wherein said drift region includes a structure having at least first and second trench capacitors extending between said source region and said drain region, said trench capacitor having an inner plate and a dielectric material adjacent to said inner plate; and further includes a stack having at least a first region of a first conductivity type, a second region of a second conductivity type, and a third region of said first conductivity type, wherein said stack lies between said at least first and second trench capacitors and in contact with said dielectric of said first and second trench capacitors;
wherein, when said device is in an on state, current flows between said source and drain regions through said second region of said second conductivity type; and, when said device is in an off/blocking state, said second conductivity region is depleted four ways into said first and third regions of said stack and into said first and second trench capacitors.

According to another feature of the present invention, there is provided
a method of making a semiconductor device comprising:
providing a semiconductor substrate having a source and a drain laterally spaced from each other with a drift region between said source and drain region;
forming an area in said drift region including at least a first region of a first conductivity type, a second region of a second conductivity type on top of said first region, and a third region of said first conductivity type on top of said second region; and
producing in said area at least two spaced trench capacitors extending between said source and said drain, wherein a stack of said first second, and third regions is formed between said trench capacitors in electrical connection with said trench capacitors.

The present invention has the following advantages:

1. A RESURF high voltage transistor is provided that uses MOS capacitor depletion in addition to PN junction depletion in the blocking mode. This allows significantly higher doping in the drift region and thus greatly reduces the on state resistance of the transistor.

2. By using depletion from four sides in the blocking mode, there is an improvement over known two-side depletion, thus improving the properties of the transistor.

BRIEF DESCRIPTION OF THE DRAWINGS

The aforementioned and other features, characteristics, advantages, and the invention in general will be better understood from the following; more detailed description taken in conjunction with the accompanying drawings, in which.

Figure 1:
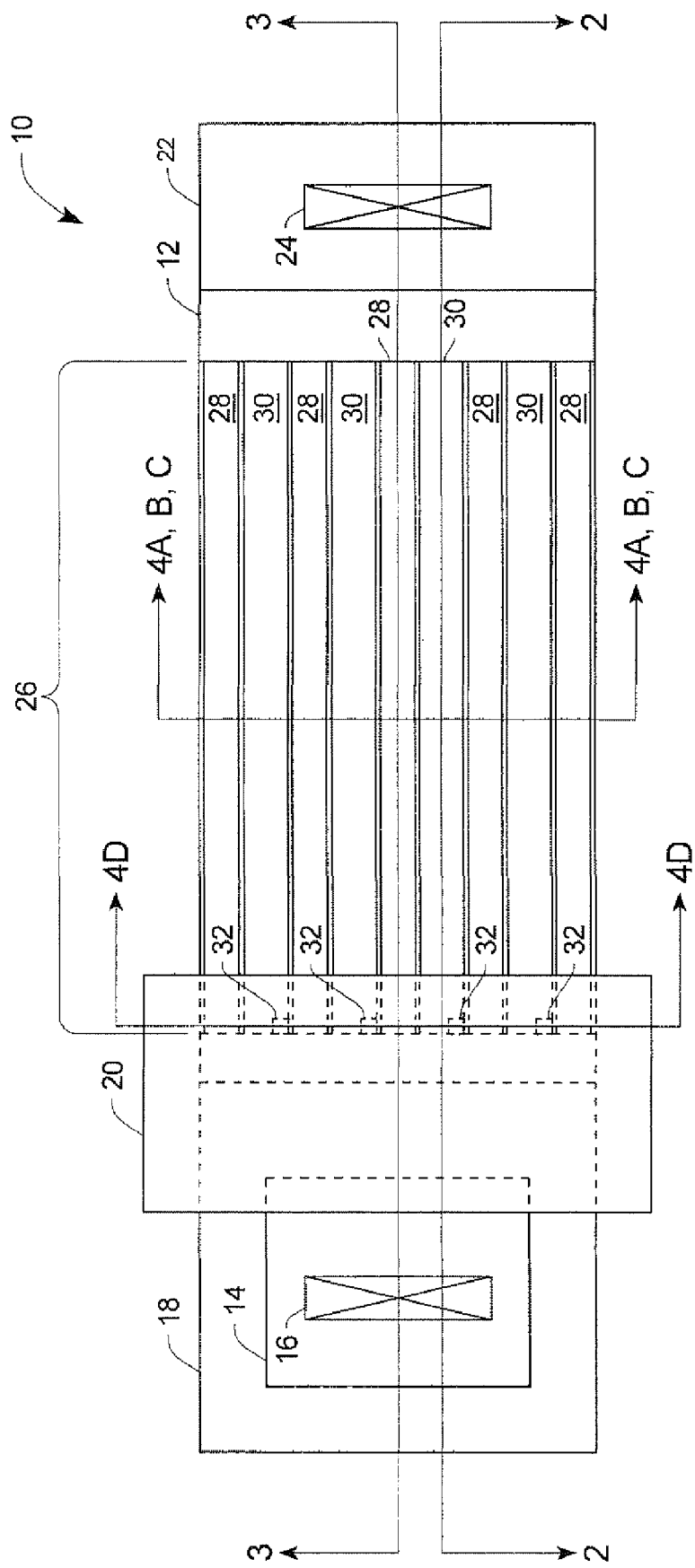
FIG. 1 is a plan, diagrammatic view of an embodiment of the present invention.

It will be appreciated that for purposes of clarity and where deemed appropriate, reference numeral have been repeated in the figures to indicate corresponding features. Also, the relative size of various objects in the drawings has in some cases been distorted to more clearly show the invention.

DETAILED DESCRIPTION OF THE INVENTION

Example embodiments of the invention are now provided. While these illustrate application of concepts to silicon-based power devices, it is intended that the principles disclosed herein will apply to a wide variety of semiconductor devices, including those formed with compound semiconductor materials, e.g., silicon carbide, as well as integrated circuits. Although examples of devices reference specific conductivity types, and incorporation of specific materials, e.g., dielectrics and conductors, these are only exemplary and it is not intended that the invention be limited to embodiments that incorporate such conventional components or methodologies. For example the embodiments shown herein are NMOS transistors, but the present invention is also applicable to a PMOS transistor by reversing the doping polarities.

Referring now to FIG. 1, there is shown an embodiment of the present invention. As shown, RESURF transistor 10 includes a semiconductor N⁻ substrate 12 with a source 14 having a p− well 16, gate 20, drain 22 having a drain contact 24, and a drift region 26 between source 14 and drain 22. Drift region 26 incorporates the trench MOS capacitor/ P⁺/N⁺ junction hybrid structure. More particularly, the hybrid structure 26 includes spaced trench MOS capacitors 28 separated by P⁺/N⁺ stacks 30. Each of the P⁺/N⁺ stacks 30 have a vertical P⁺ region 32, which are also shown in FIG. 4D, and which make contact with each P⁺ and N⁺ layer in their respective stack so that all the P+ regions are connected to each other in parallel, and likewise all the N+ regions are connected to each other in parallel. The P⁺ doped regions 32 are also electrically tied to the poly filling in the trench capacitors 28 by a metal layer represented schematically by the connections 34 in FIG. 4D. The regions 32 connect the P⁺ layers in the P⁺/N⁺ stacks 30 with the P⁺ polysilicon in the trench capacitors 28 in order to create four sided depletion regions in the N⁺ layers in the P⁺/N⁺ stacks 30 as shown in FIG. 4C.

Figure 2:
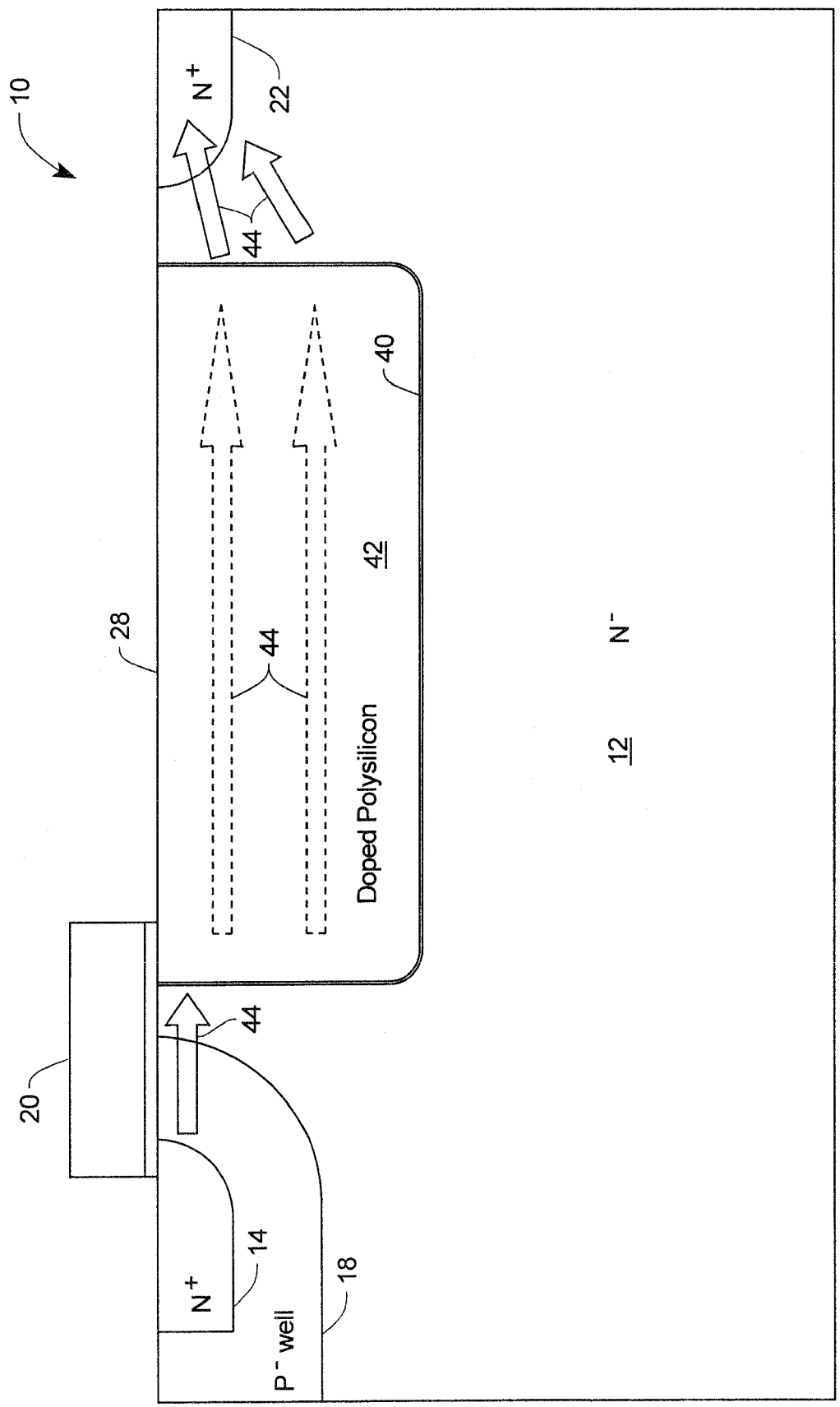
FIG. 2 is an elevational, cross-sectional, diagrammatic view taken along line 2-2 in FIG. 1.
Figure 3:
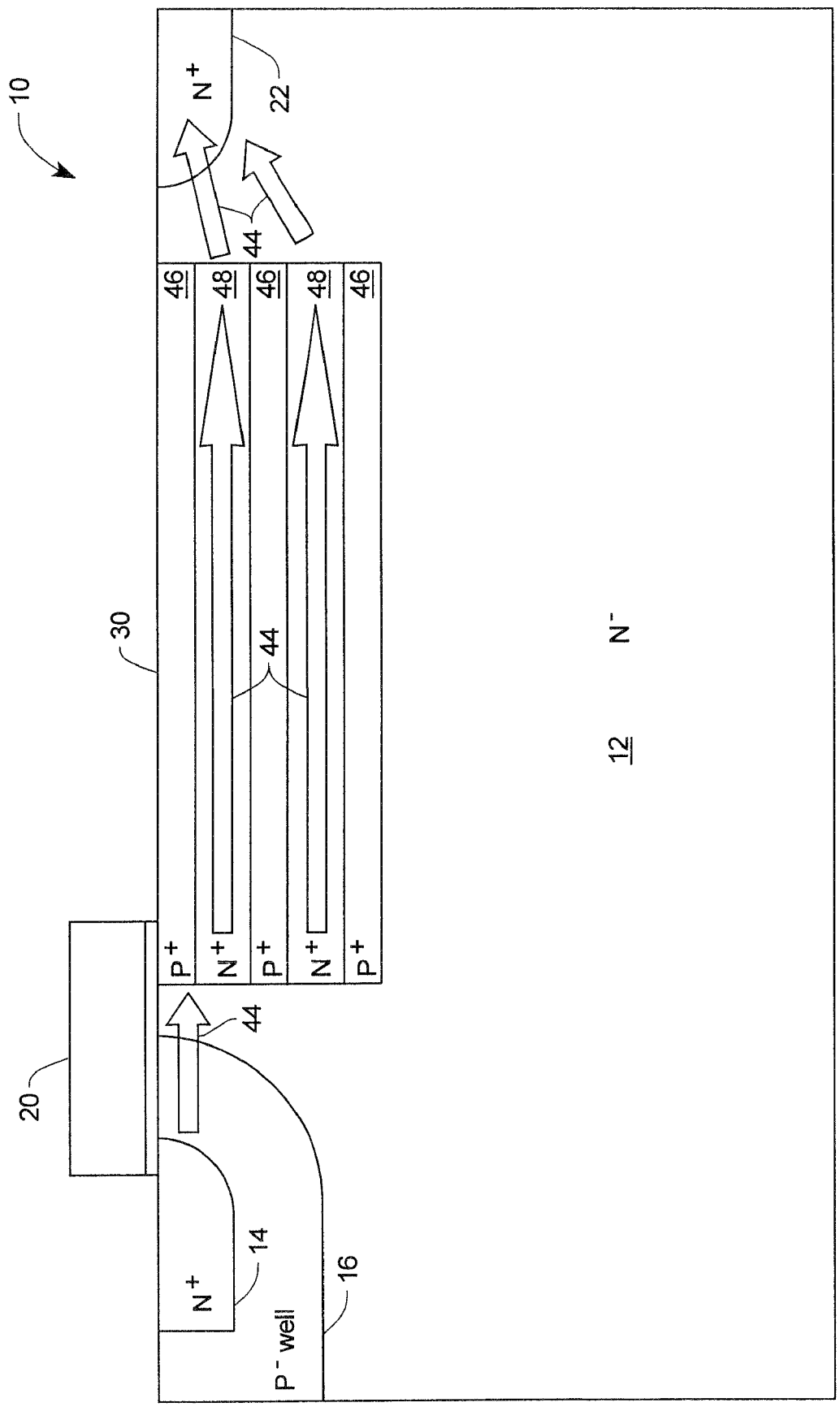
FIG. 3 is an elevational, cross-sectional, diagrammatic view taken along line 3-3 in FIG. 1.

FIGS. 2 and 3 are respective elevational, cross-sectional, diagrammatic views taken along line 2-2 and 3-3 in FIG. 1. FIG. 2 shows the profile of one of the trench capacitors 28 showing the silicon dioxide dielectric layer 40 and the polysilicon 42. FIGS. 2 and 3 indicate with arrows 44 the current flowing between source 14 and drain 22 through the P⁺/N⁺ stacks 30 when the RESURF transistor 10 is on. The P⁺/N⁺ stacks 30 includes regions 46 of a first conductivity type of P⁺ interleaved with regions 48 of a second conductivity type of N⁺. As shown in FIGS. 2 and 3, the current flows principally through the N⁺ regions 48.

FIGS. 4A-4D, are cross-sectional diagrammatic views taken along line 4A, B, C-4A, B, C in FIG. 1. As shown, trench capacitors 28 include trenches 50 having silicon dioxide sidewalls 40 filled with doped polysilicon 42. N⁺ regions 48 are conduction/blocking regions depending on whether the RESURF transistor 10 is on or off.

Figure 4A:
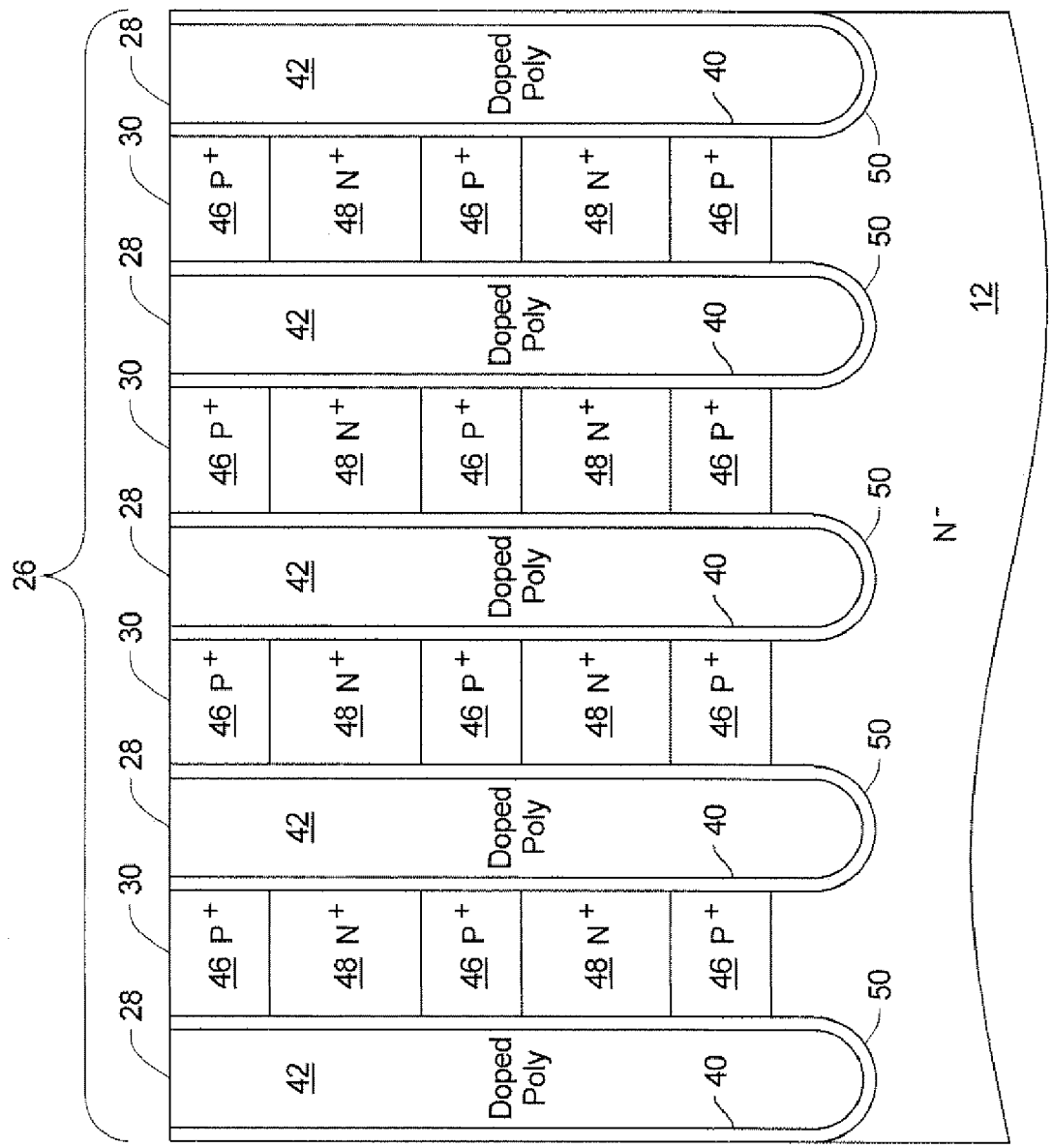
FIGS. 4A-4C are cross-sectional diagrammatic views taken along line 4A, 13, C -4A, 1B, C in FIG. 1.
Figure 4B:
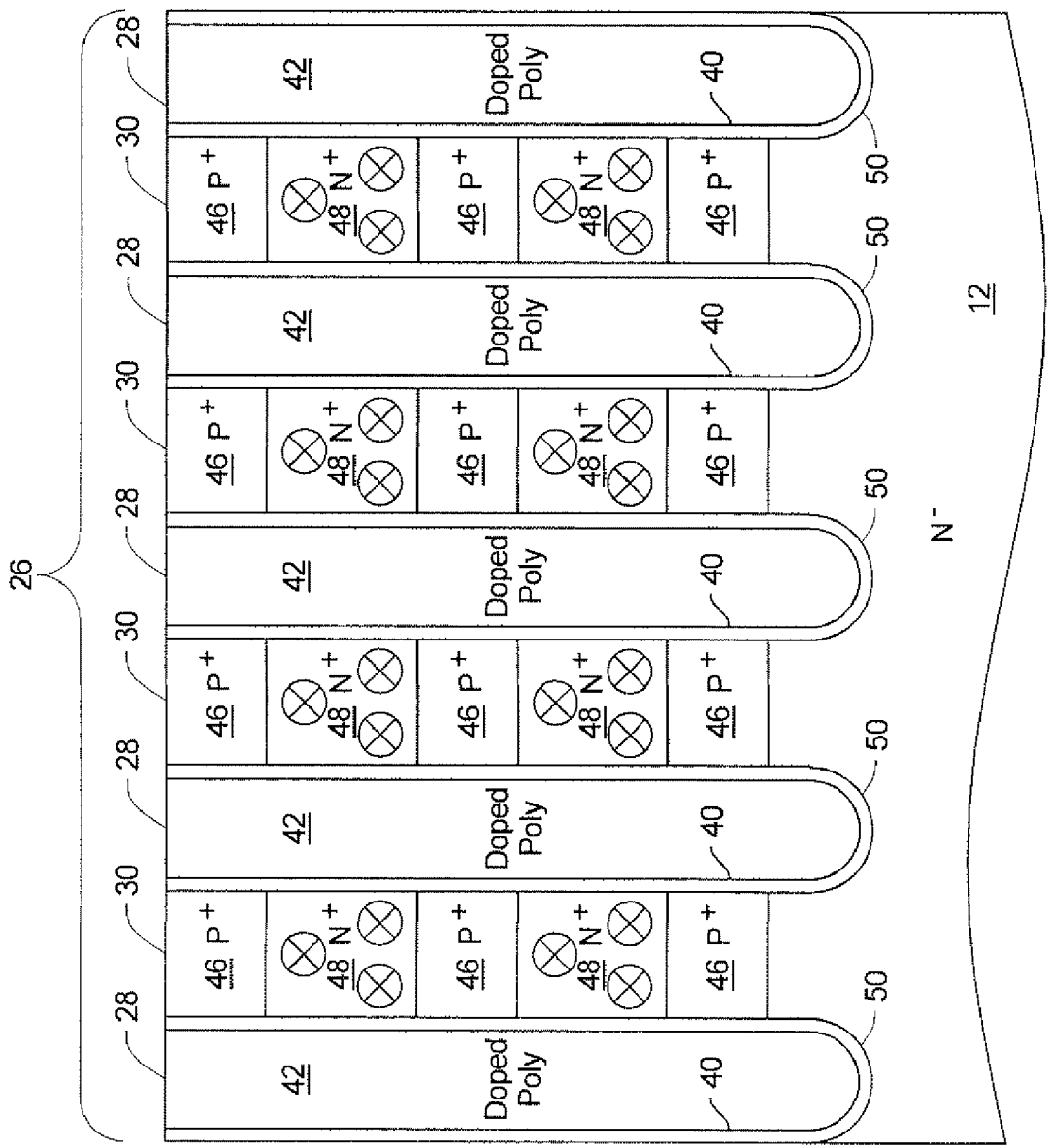
Figure 4C:
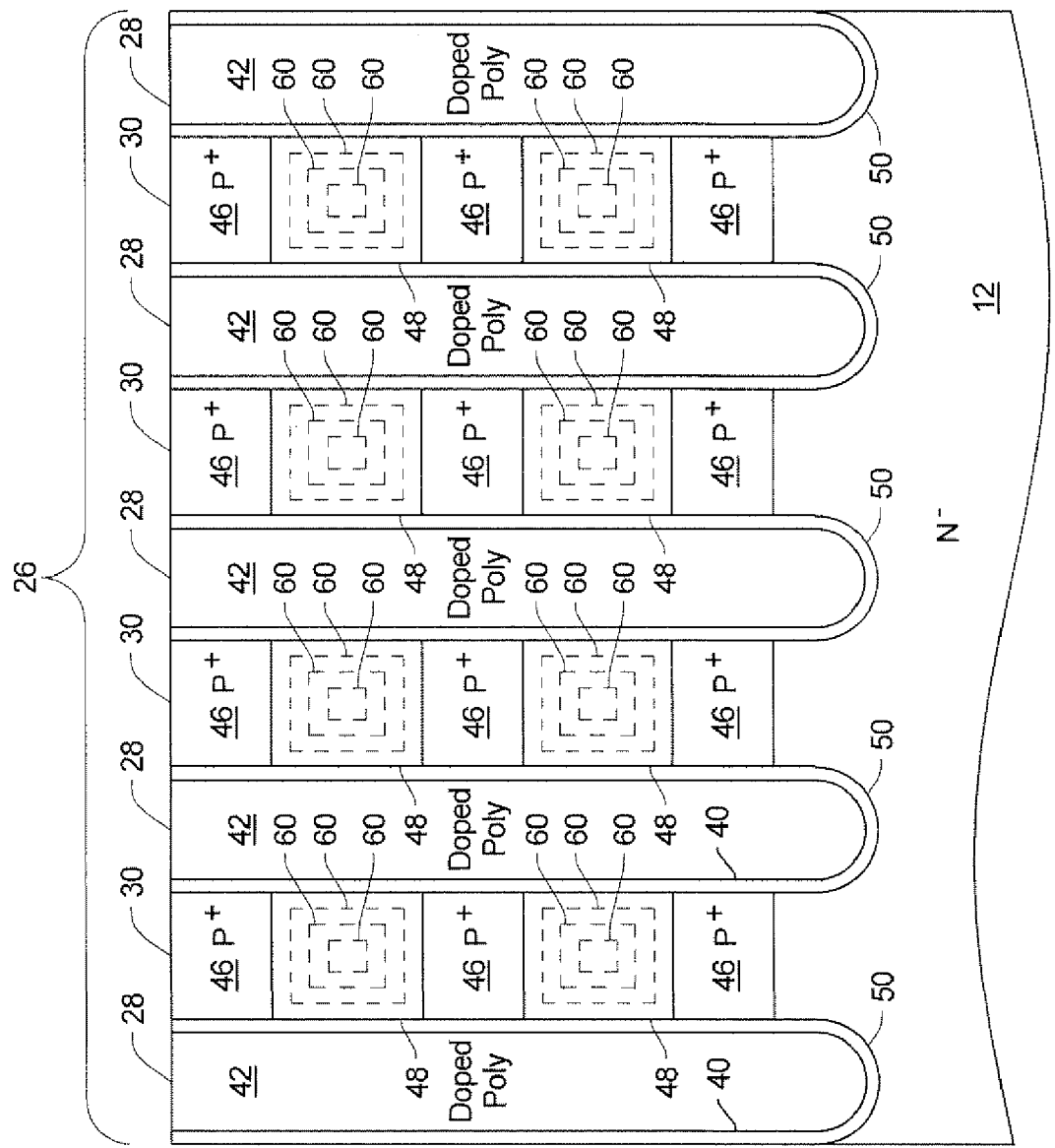
Figure 4D:
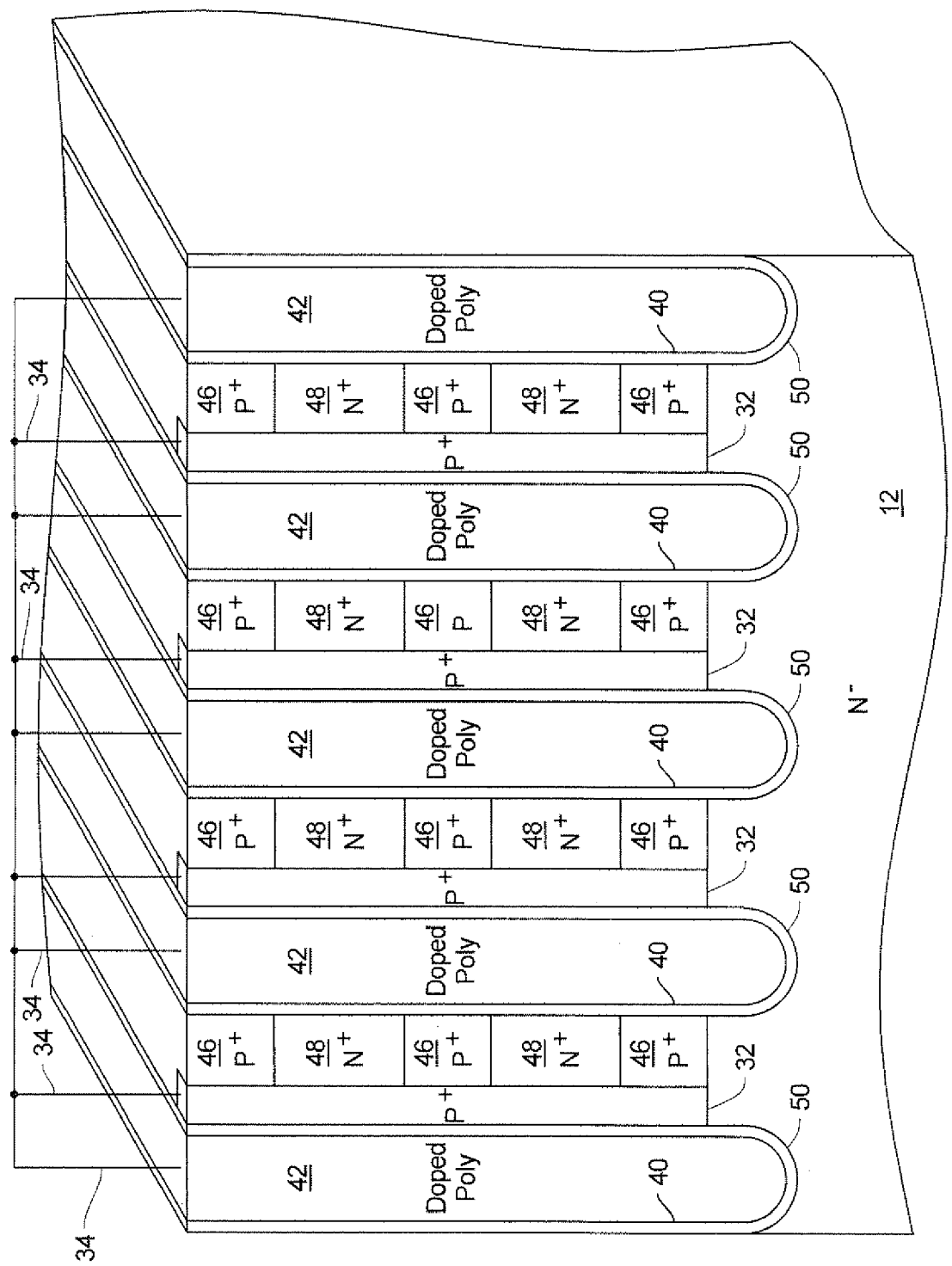
FIG. 4D is a cross-sectional, diagrammatic view taken along line 4D-4D in FIG. 1.

FIG. 4B shows the semiconductor device in the on state in which the junctions of the P⁺/N⁺ layers of P⁺/N⁺ stacks 30 and the trench capacitors 28 are biased so as not to deplete the N⁺ doped conduction regions 48. Current is shown as flowing into the plane of the figure as depicted by the crossed circles 56.

FIG. 4C shows the semiconductor device in the off state in which the junctions between the P⁺/N⁺ layers of the P⁺/N⁺ stacks 30 and the trench capacitors 28 are biased so as to deplete the N⁺ doped conduction regions 48 from four sides. Current flow is thus blocked as shown by the dashed line rectangles 60. Because of the four-sided depletion, the doping of the N⁺ layer 48 layers can be significantly higher (up to a factor of 2) or the size of the N⁺ layers 48 can be significantly increased, or a combination of increasing the doping and the size of the N⁺ layers 48, than with two sided depletion regions while still depleting the N⁺ layers 48 when the RESURF transistor 10 is off. The higher doping and/or increased surface area of the N⁺ region significantly reduces the on state resistance of the device. and/or increased surface area of the N⁺ region significantly reduces the on state resistance of the device.

FIG. 4D is a cross-sectional, diagrammatic view taken along line 4D-4D in FIG. 1. The P⁺ regions 32 form a connection of the P⁺ layers 32 to the top of the RESURF transistor 10, which are joined together with the P⁺ polysilicon 42 in the trench capacitors 22 by metallization (not shown) in one embodiment of the invention. The common connection 34 of the P⁺ layers 32 and the P³⁰ polysilicon 42 in the trench capacitors 28 provide uniformity in the depletion regions 46 when the RESURF transistor 10 is off.

Figure 5A:
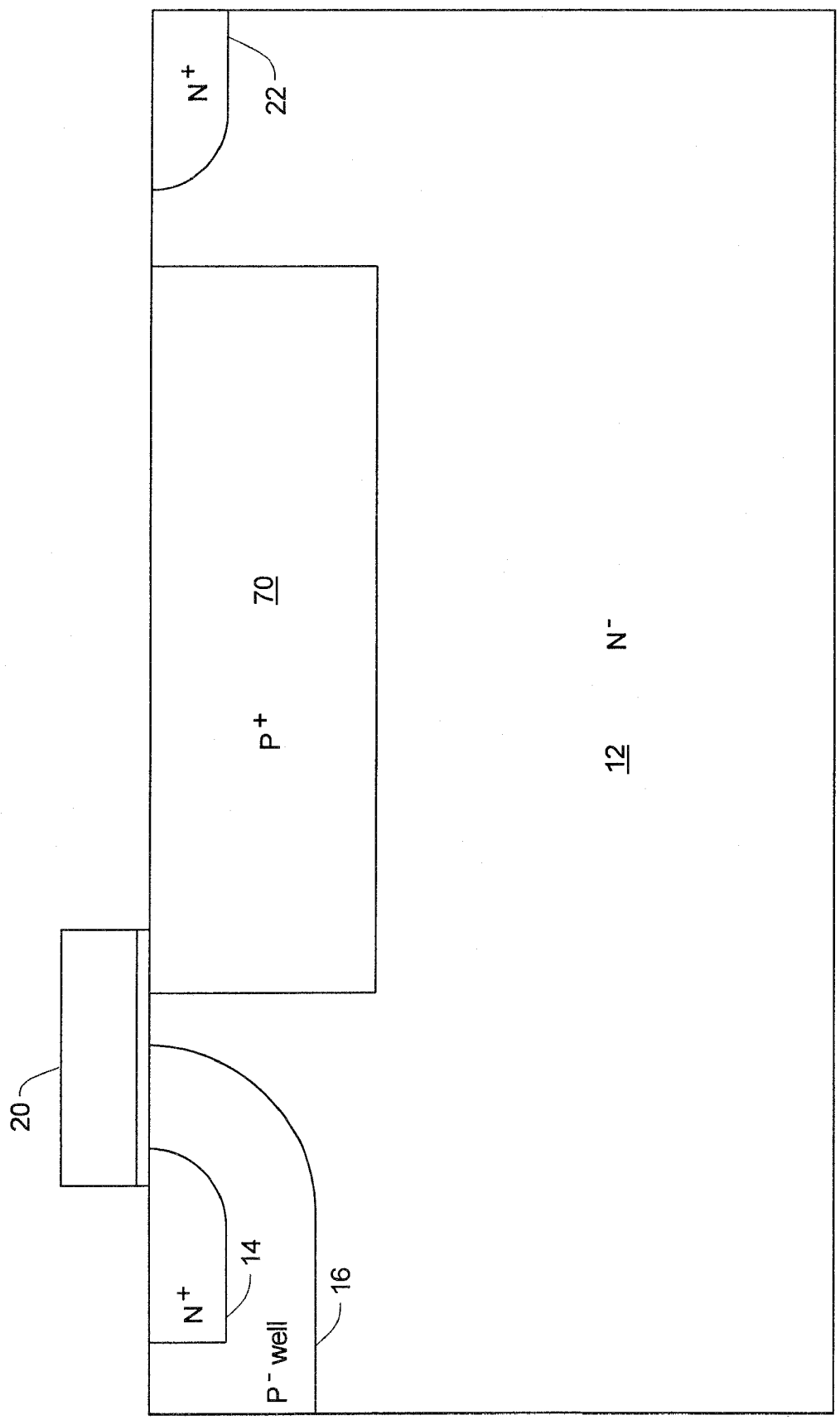
FIGS. 5A-5E are cross-sectional diagrammatic views illustrating select details in fabricating the invention of FIG. 1.
Figure 5B:
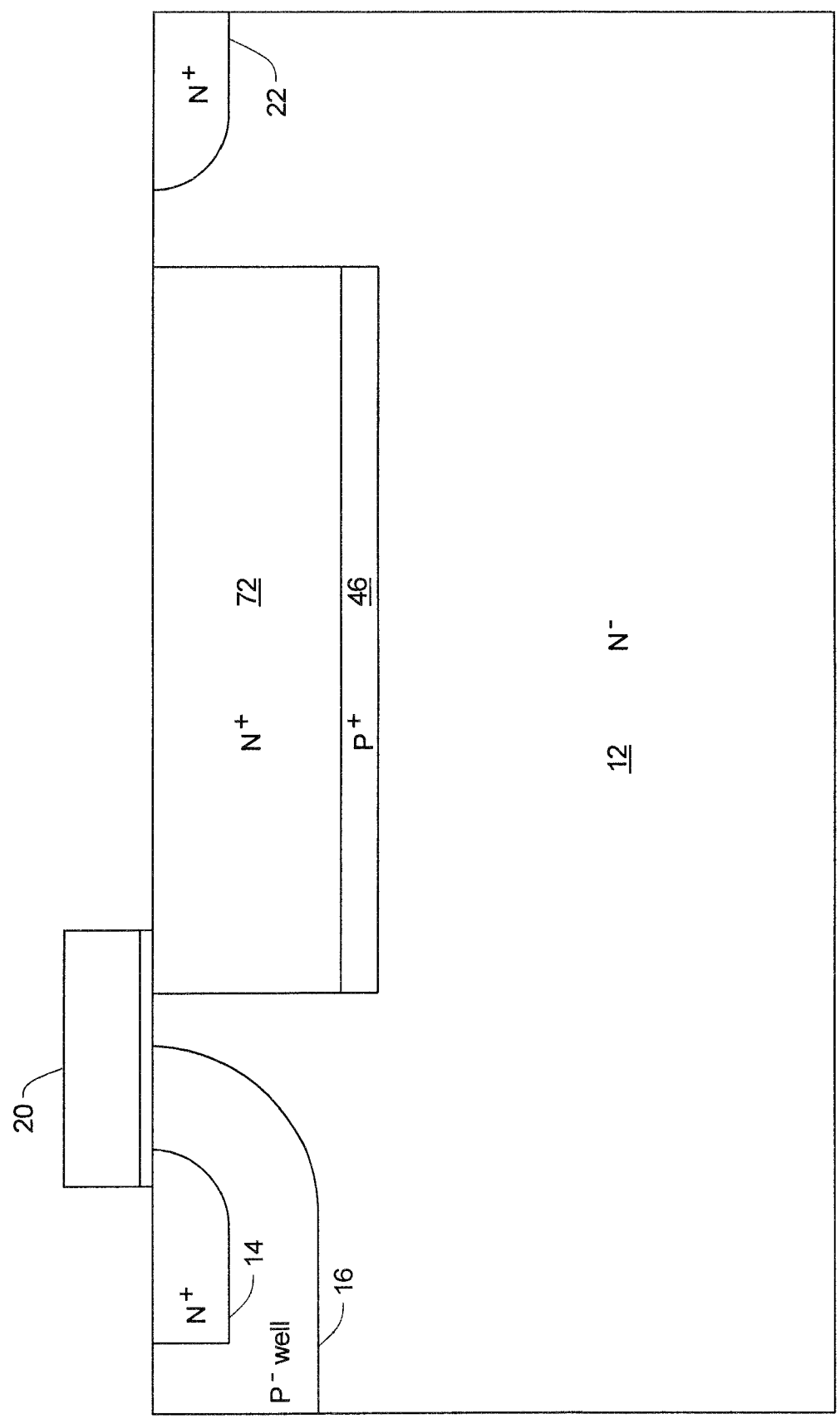
Figure 5C:
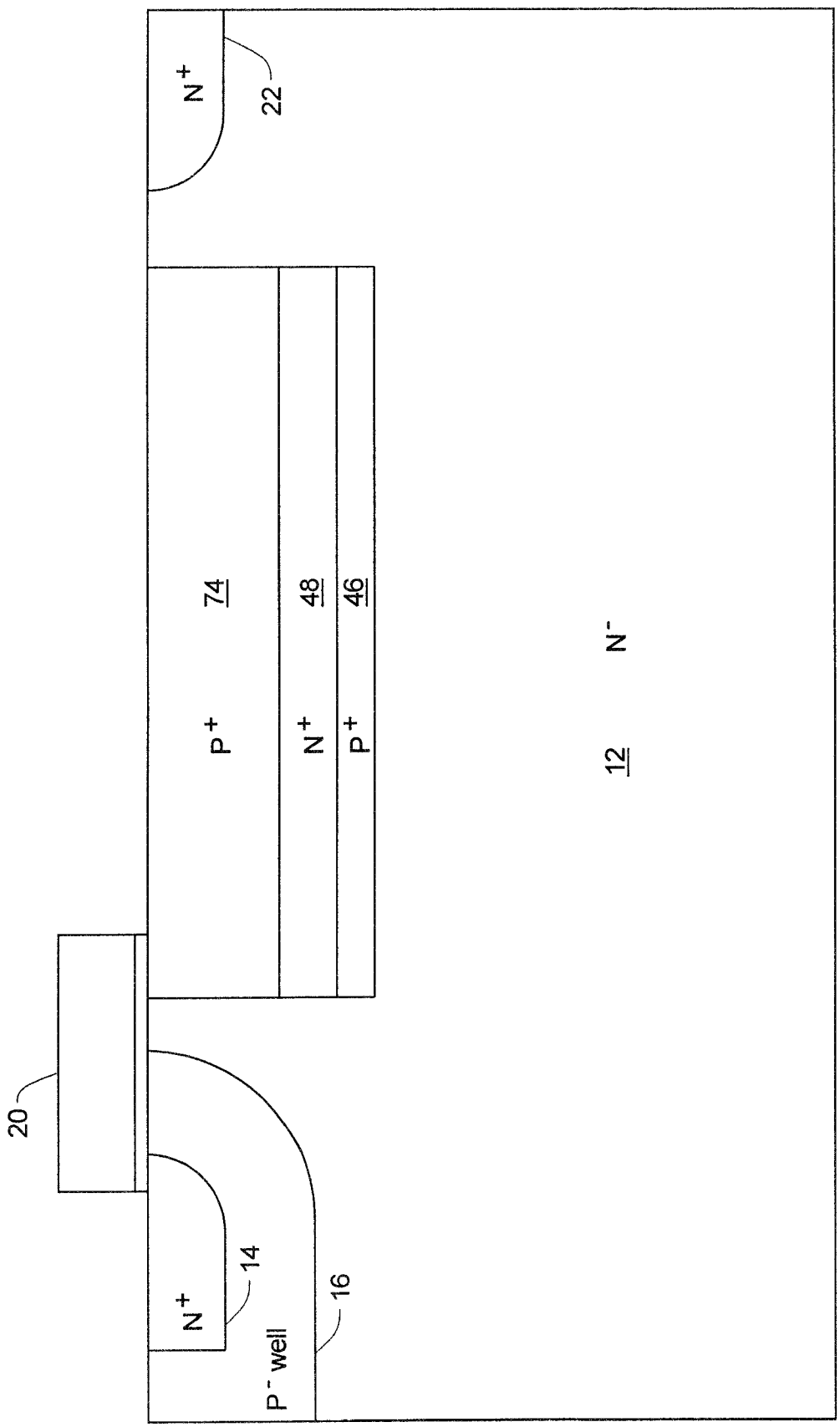
Figure 5D:
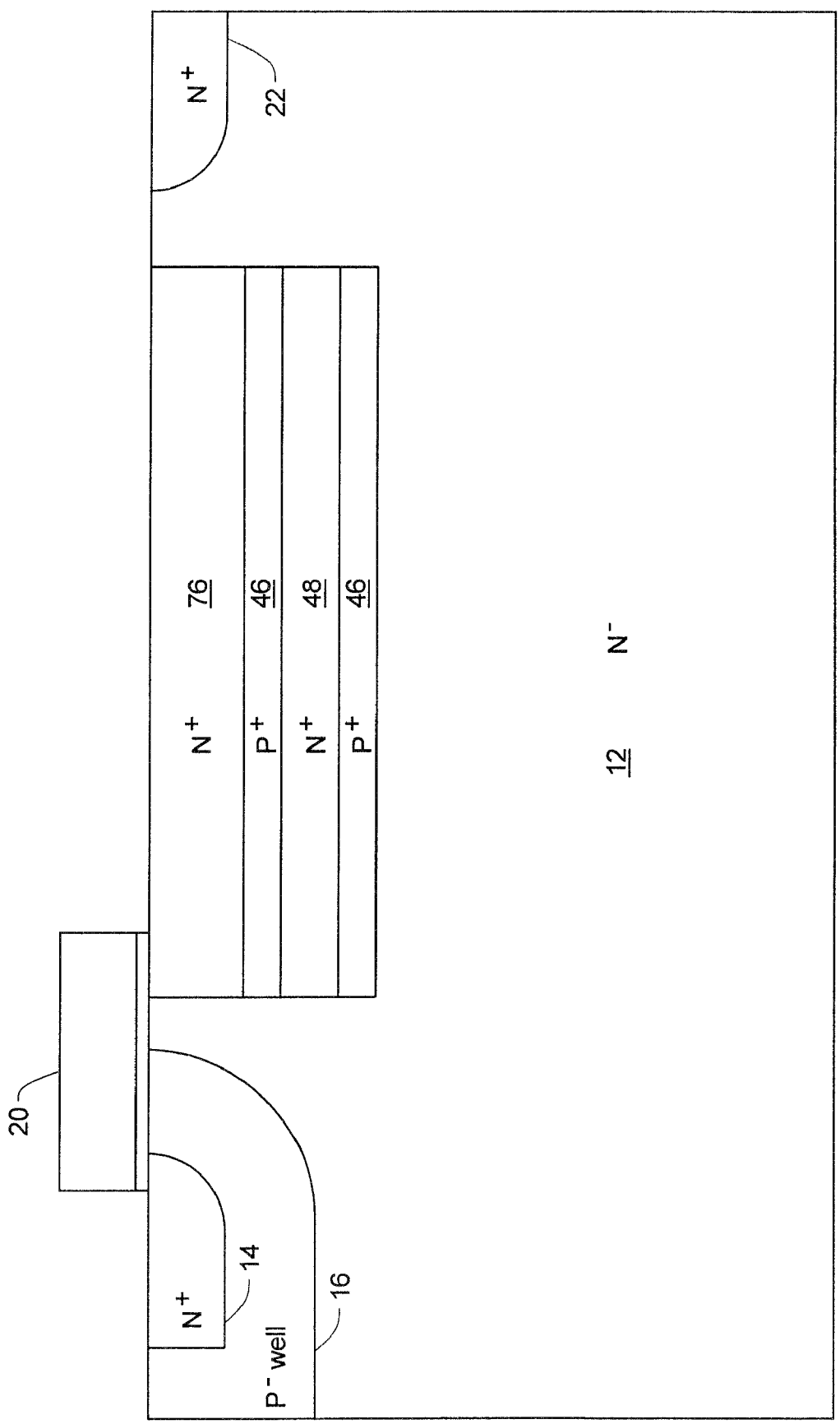
Figure 5E:
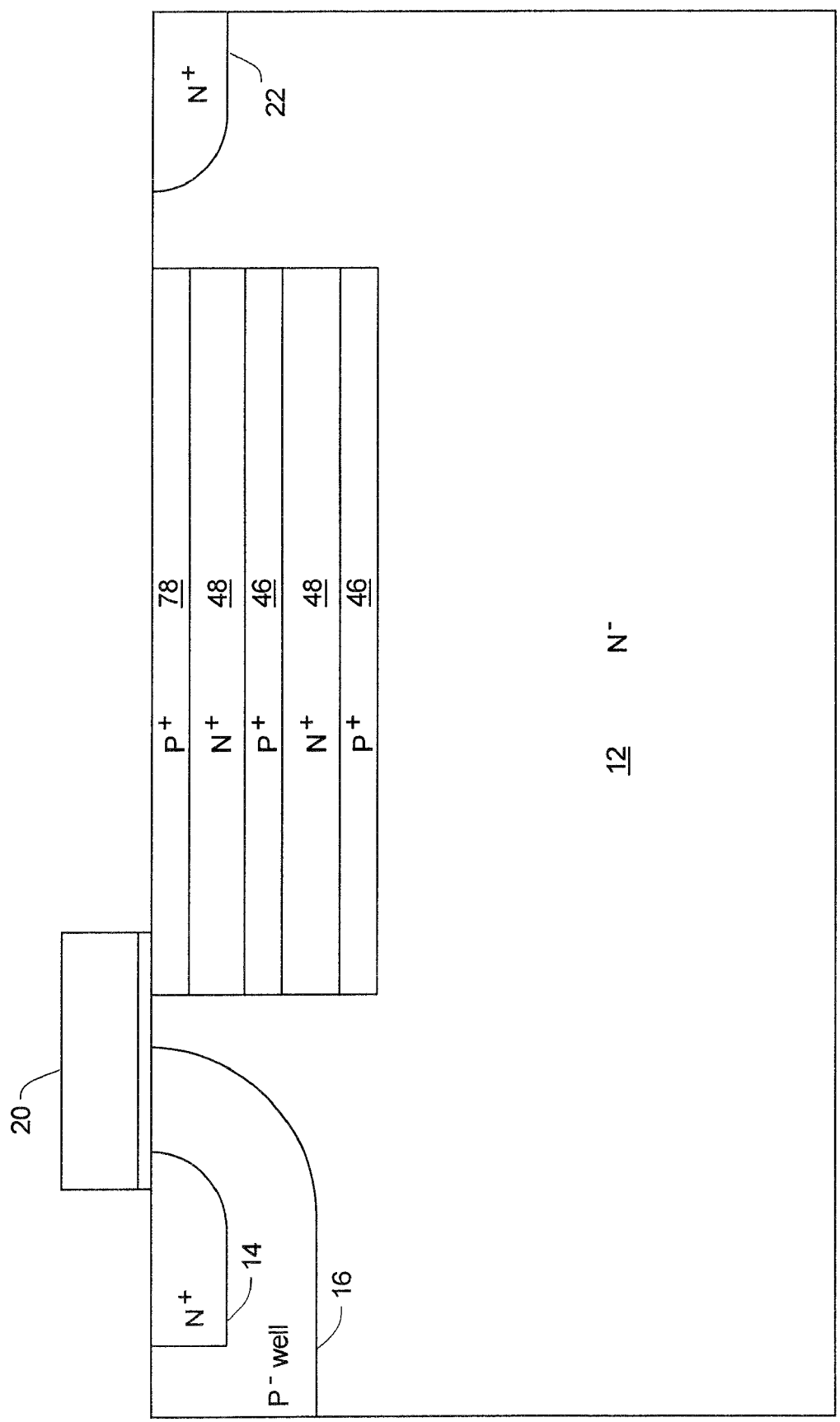

FIGS. 5A-5C are cross-sectional diagrammatic views illustrating select details in fabricating the invention of FIG. 1. to show select details in fabricating the P⁺/N⁺ layers of the P⁺/N⁺ stacks 30. FIGS. 5A-5C show successive P⁺ and N⁺ implants 70, 72, 74, 76, and 78 to form the multiregion area for the P⁺/N⁺ stacks 30. Those skilled in the art will appreciate that the P⁺/N⁺ layers can also be formed by diffusion or with epitaxial layers.

Figure 6A:
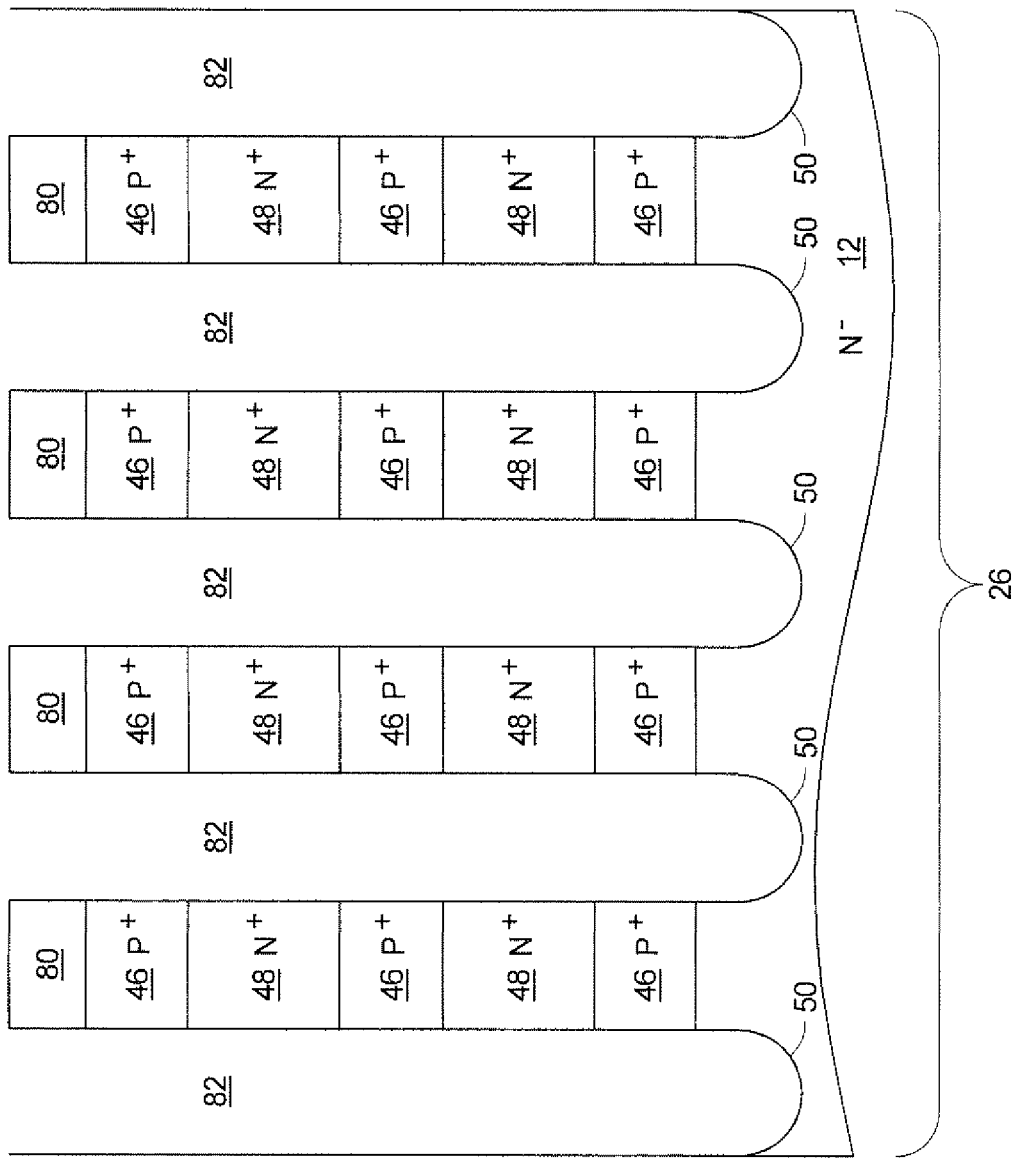
FIGS. 6A-6D are cross-sectional diagrammatic views illustrating further select details in fabricating the invention of FIG. 1.
Figure 6B:
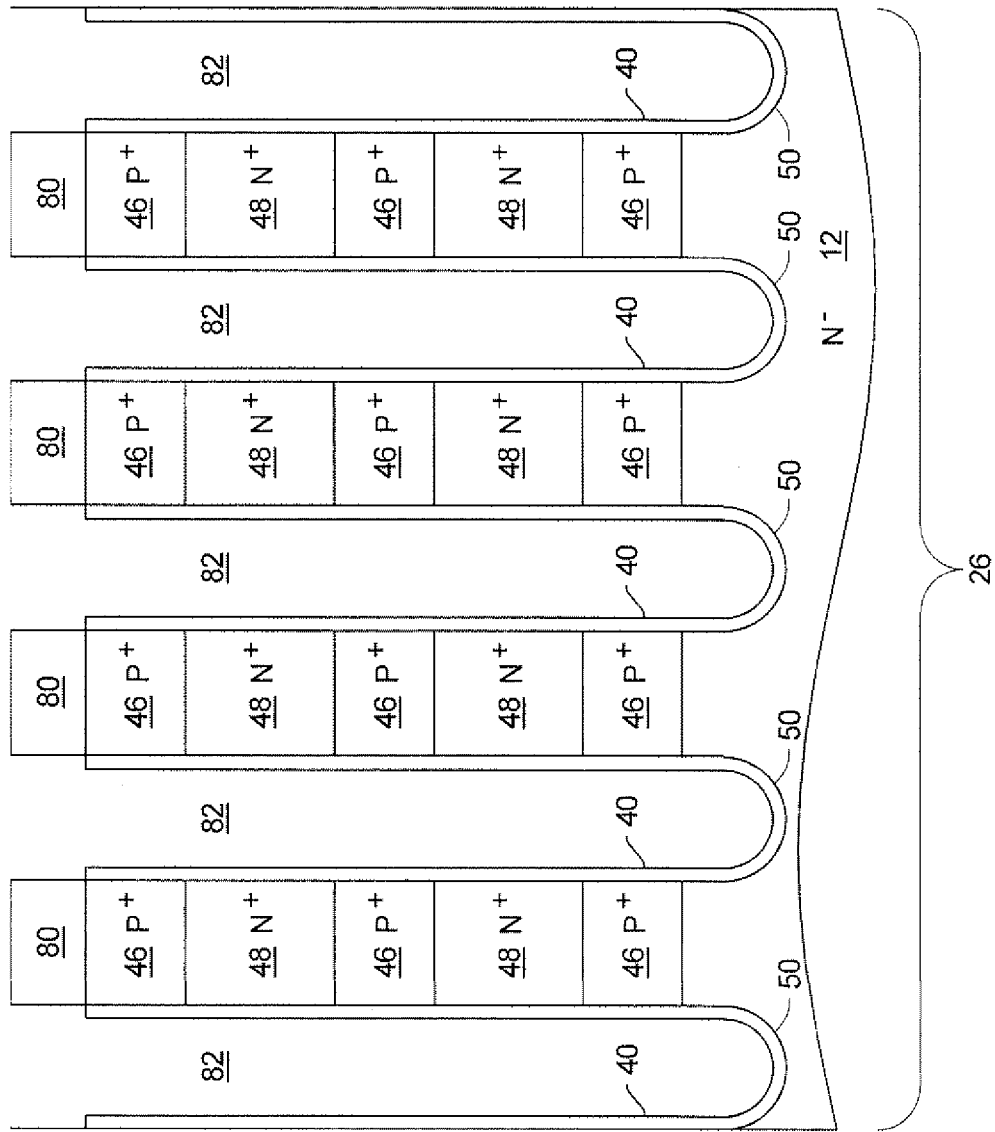
Figure 6C:
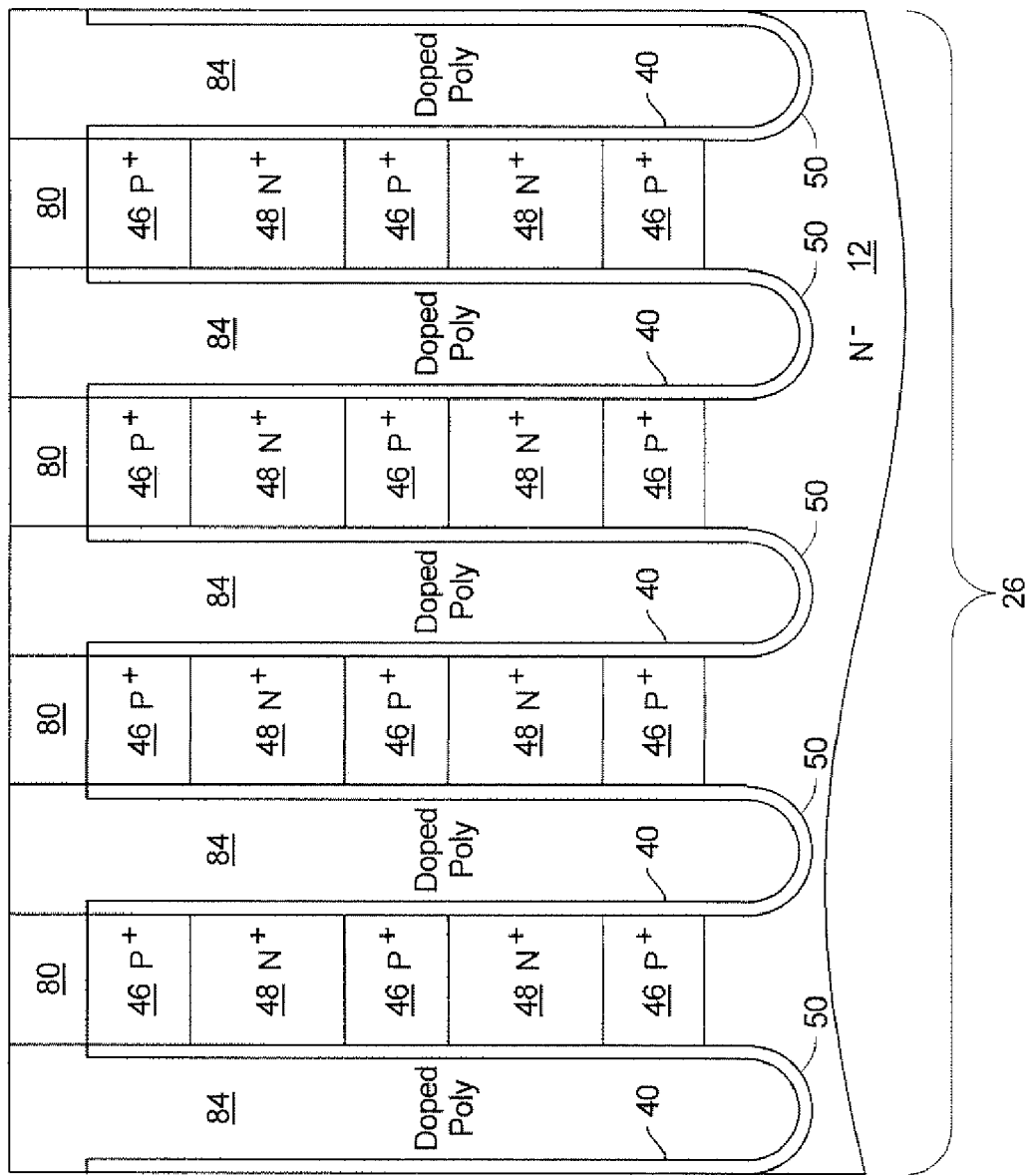

FIGS. 6A-6D are cross-sectional diagrammatic views illustrating further select details in fabricating the invention of FIG. 1 to show select details in forming the trench capacitors 28. FIG. 6A shows a mask 80 on the upper surface of semiconductor substrate 12. One or more trenches 82 are etched in the P⁺/N⁺ stacks 30 for forming trench capacitors 28. FIG. 6B shows silicon dioxide 40 deposited or grown on the side walls and bottom of trenches 82. FIG. 6C shows P⁺/N⁺ polysilicon 84 deposited in the trenches 82 to form trench the capacitors 28. The mask 80 and the portion of the P⁺/N⁺ polysilicon above the substrate 12 are then removed.

Figure 6D:
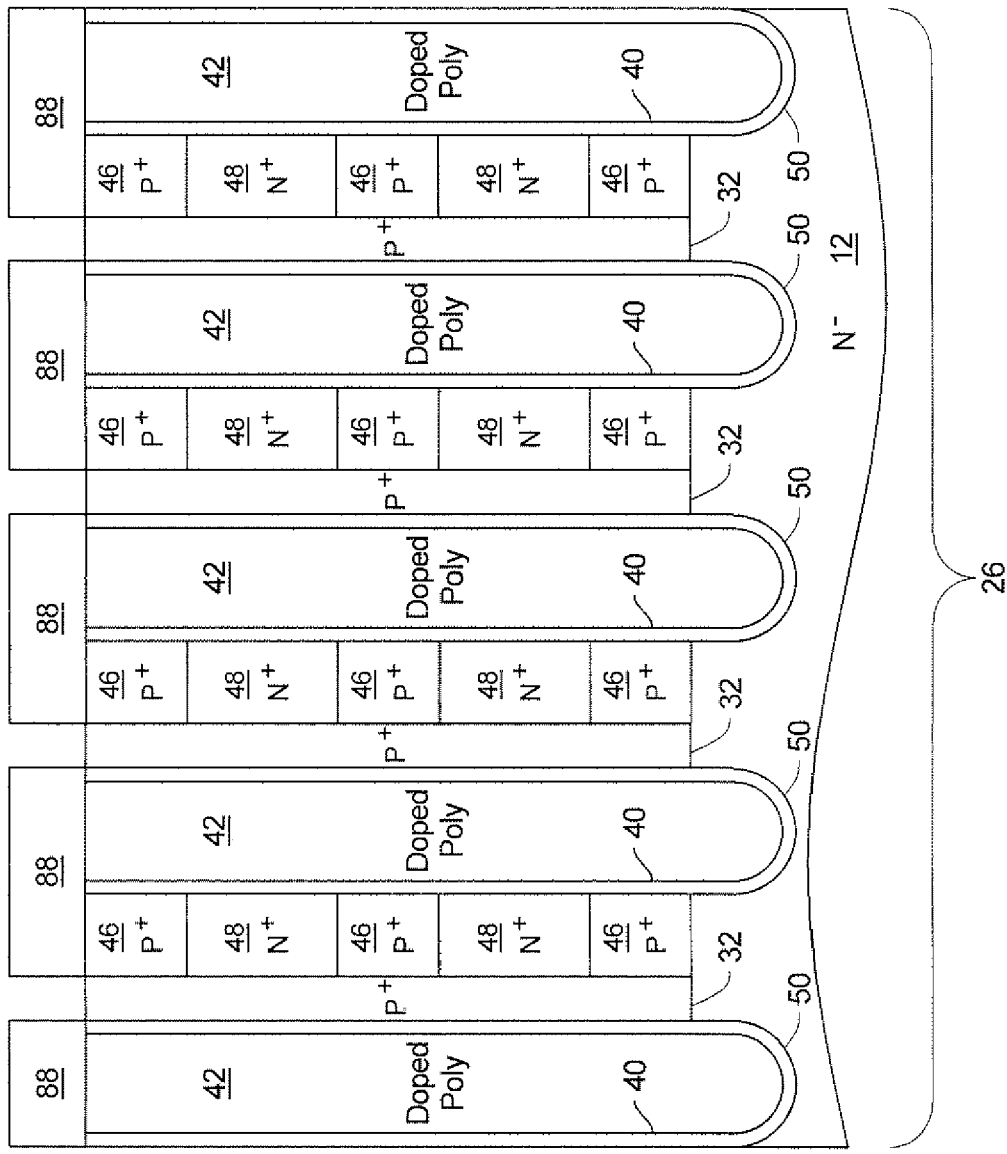

FIG. 6D shows another mask 88 formed on the top of the substrate 12 and the P⁺ regions 46 formed by ion implantation in one embodiment. After the regions 32 are formed, the mask 88 is removed.

The trench capacitors 28 are fabricated in the same manner as a trench gate, and therefore do not require any additional masks. Using p+ pillars in place of the trench capacitors 28 would require additional processing not needed with the trench capacitors 28.

Figure 7:
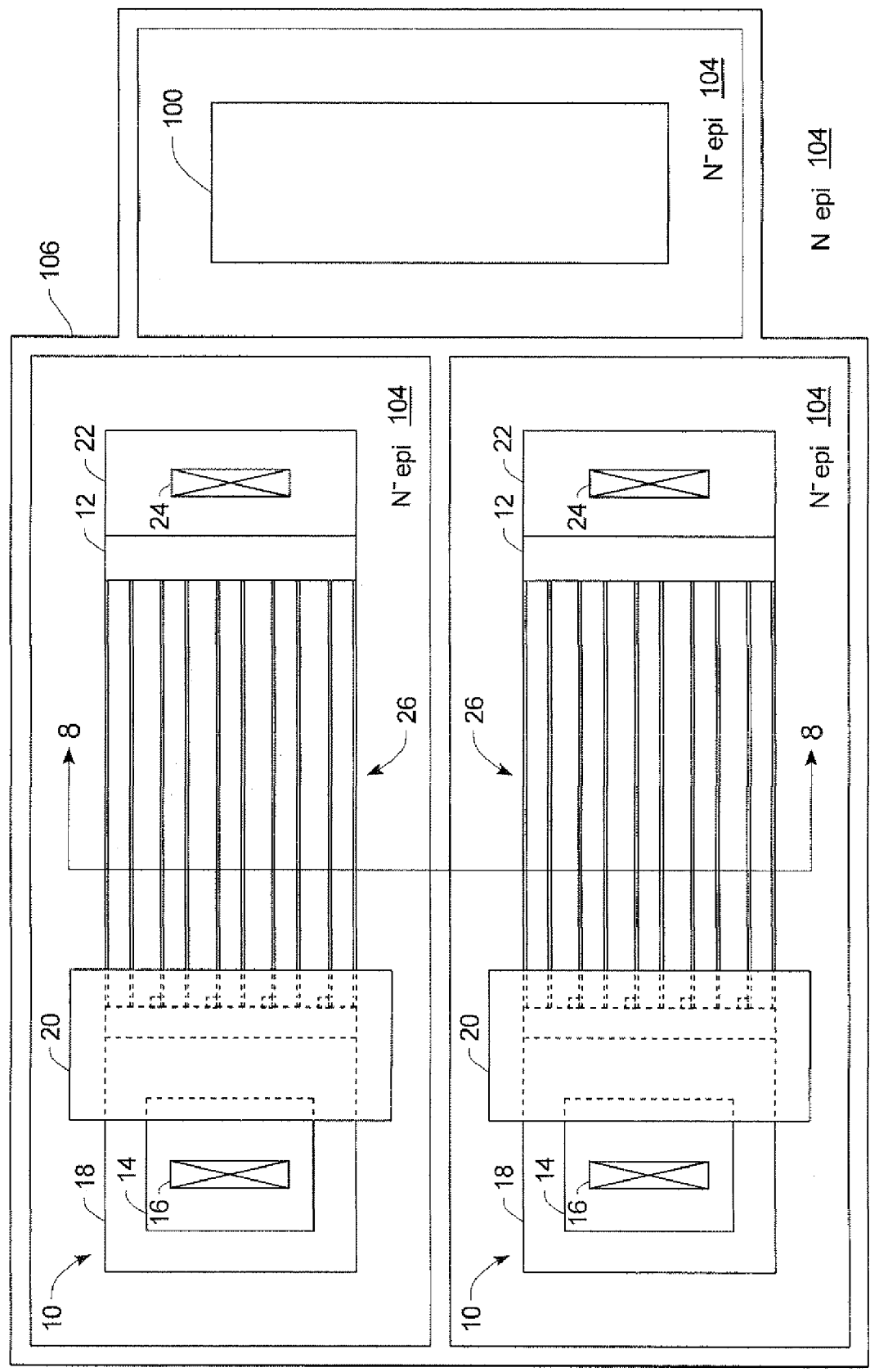
FIG. 7 is a plan, diagrammatic view of two of the embodiments shown in FIG. 1 together with an additional device on a single substrate with an isolation region that surrounds each of the three devices.

FIG. 7A is a plan, diagrammatic view of two of the RESURF transistors 10 shown in FIG. 1 together with an additional device 100 on a single P⁻ substrate 102 (shown in FIG. 7B) with an N⁻ epi layer 104 and an isolation region 106 that surrounds each of the three devices.

FIG. 7B is an elevational, cross-sectional, diagrammatic view taken along line 7B-7B in FIG. 7A. As can be seen in FIG. 7A the trench capacitors 28 extend down into the P⁻ substrate 102 as does the isolation region 106 to thereby isolate the three devices shown in FIG. 7A.

The additional device 100 may be an controller for a synchronous buck converter, for example, that controls the two RESURF transistors 10 with the three devices interconnected by wire bonds.

Figure 8:
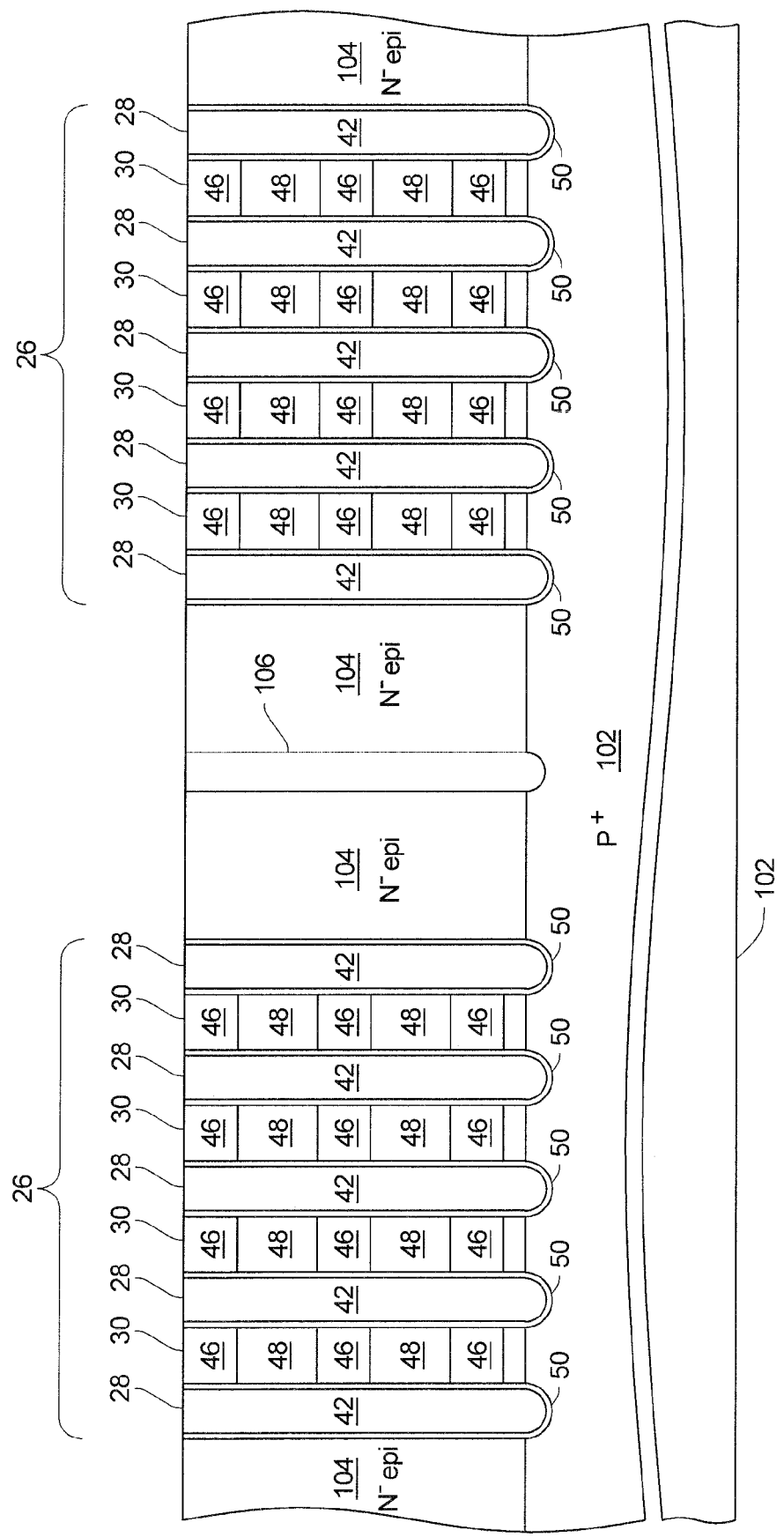
FIG. 8 is an elevational, cross-sectional, diagrammatic view taken along line 8-8 in FIG. 7.
Figure 9:
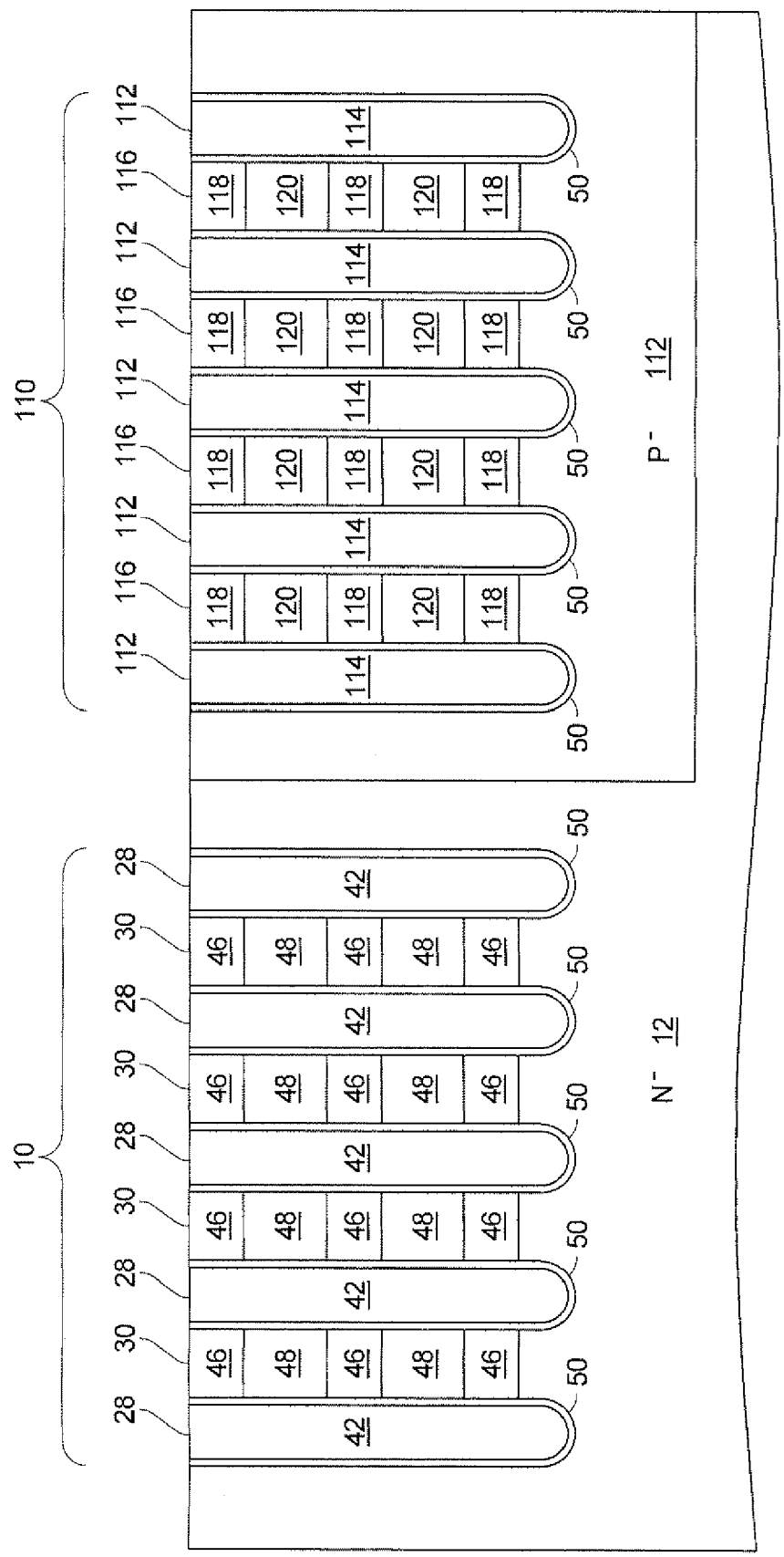
FIG. 9 is an elevational, cross-sectional, diagrammatic view of the embodiment shown in FIG. 1 together with a complementary embodiment in a CMOS integrated circuit arrangement.

FIG. 8 is an elevational, cross-sectional, diagrammatic view of the RESURF transistor 10 shown in FIG. 1 together with a complementary RESURF transistor 110 in a P⁻ well 112 used in CMOS integrated circuits. The majority doping types in the complementary RESURF transistor 110 are opposite to the doping types in the RESURF transistor 10. Thus, the corresponding capacitors 112 are filled with N+ polysilicon 114, and each of the P+/N+ stacks 116 have N+ top middle and bottom layers 118, and P+ layers 120 between the N+ layers 118.

Although specific embodiments of the invention have been shown and described, it will be understood that variations and modifications can be effected within the spirit and scope of the invention. Thus, other materials well known to those skilled in the art can be used to form the trench capacitors and other processes can be used to form the p/n stacks and trench capacitors. In addition, the device can have more or less than the number of trench capacitors shown, and more or less than the number of alternating regions of said first and second conductivity types in said stacks.

What is claimed is:

1. A semiconductor device comprising:
   a semiconductor substrate;
   a source region and a drain region provided in said substrate; wherein said source region and said drain region are laterally spaced from each other;
   a drift region in said substrate between said source region and said drain region;
   wherein said drift region includes a structure having at least first and second trench MOS capacitors extending from proximate said source region to proximate said drain region; and further includes a vertical stack having at least three regions, one on top of the other, including at least a first region of a first conductivity type, a second region of a second conductivity type, and a third region of said first conductivity type, wherein each of said first, second, and third regions extend from proximate said source region to proximate said drain region and extends between said first and second trench MOS capacitors;
   wherein, when said device is in an on state, current flows between said source and drain regions through said second region of said second conductivity type; and, when said device is in an off/blocking state, said second conductivity region is depleted by four separate electric fields from said first and third regions of said stack and from said first and second trench MOS capacitors.

2. The device of claim 1 wherein said first and third regions of said first conductivity type are P regions and wherein said second region of said second conductivity type is an N region.

3. The device of claim 1 wherein said first and third regions of said first conductivity type are N regions and said second region of said second conductivity type is a P region.

4. The device of claim 1 wherein said first and second trench MOS capacitors include a silicon dioxide wall and a doped polysilicon filling the rest of the first and second trench MOS capacitors.

5. The device of claim 1 wherein said device is a RESURF transistor.

6. The device of claim 1 wherein said region of said second conductivity type of said stack is doped significantly higher than a comparable region in a RESURF transistor not employing said first and second trench MOS capacitors.

7. The device of claim 4 further including an electrical connection between said polysilicon and said substrate at a location in said substrate proximate an end of said drift region.

8. The device of claim 7 wherein said end of said drift region is an end closest to said source region.

9. The device of claim 1 wherein said first, second, and third regions of said stack are layered vertically.

10. The device of claim 1 wherein a well region of said first conductivity type under a gate is positioned between said source region and said first and second trench MOS capacitors and between said source region and said stack.

11. A semiconductor device comprising:
    a semiconductor substrate;
    a source region and a drain region provided in said substrate; wherein said source region and said drain region are laterally spaced from each other; and
    a drift region in said substrate between said source region and said drain region, said drift region comprising:
    i) first and second trench MOS capacitors extending between said source region and said drain region and filled with highly conductive polysilicon;
    ii) a stack having at least a first region of a first conductivity type, a second region of a second conductivity type, and a third region of said first conductivity type, wherein each of said first, second, and third regions are positioned between said source region and said drain region and extend between said first and second trench MOS capacitors;
    wherein each of said first and second trench MOS capacitors includes a silicon dioxide wall and highly doped polysilicon filling the rest of the trench capacitor, both of said polysilicon filling of said first and second trench MOS capacitors being electrically connected together.

12. The device of claim 11 having means for depleting said second region by four separate electric fields.

13. The device of claim 12 wherein two of said electric fields are orthogonal to the other two electric fields.

14. The device of claim 12 further including an electrical connection between said polysilicon and said substrate at a location in said substrate proximate an end of said drift region.

15. The device of claim 14 wherein said end of said drift region is an end closest to said source region.

16. The device of claim 12 wherein said first, second, and third regions of said stack are layered vertically.

17. A semiconductor device comprising:
    a lightly doped semiconductor substrate having an upper surface and lower surface;
    a heavily doped source region and a heavily doped drain region of a first conductivity type in said substrate and extending from said upper surface into said substrate; wherein said source region and said drain region are laterally spaced from each other;
    an insulated gate formed on the upper surface of said substrate laterally adjacent said source region;
    a well region of a second conductivity type under said gate;
    a vertical stack of alternating first and second conductivity type layers, each layer extending laterally from proximate said well region to proximate said drain region and extending vertically from the upper surface into the substrate, said stack having at least a first layer of a highly doped first conductivity type, a second layer of a highly doped second conductivity type, and a third layer of said highly doped first conductivity type;
    at least two spaced trenches on opposite sides of said stack and extending from proximate said well region to proximate said drain region, said trenches lined with dielectric material and filled with highly conductive polysilicon;
    wherein, when said device is in an on state, current flows between said source and drain regions through said stack layers of said first conductivity type; and, when said device is in an off/blocking state, said first conductivity type layers of said stack are depleted by four separate electric fields from said second conductivity regions of said stack and from said first and second trenches.

18. The device of claim 17 wherein said first and third layers of said first conductivity type are P regions and wherein said second layer of said second conductivity type is an N region.

19. The device of claim 17 wherein said first and third layers of said first conductivity type are N regions and said second layer of said second conductivity type is a P region.

20. The device of claim 17 wherein said device is a RESURF transistor.

21. The device of claim 17 wherein said layer of said first conductivity type of said stack is doped significantly higher than a comparable region in a RESURF transistor not employing said spaced trench capacitors.

22. The device of claim 17 further including an electrical connection between said polysilicon and said substrate at a location in said substrate proximate an end of said drift region.

23. The device of claim 22 wherein said end of said drift region is an end closest to said source region.

24. The device of claim 17 wherein said first, second, and third layers are heavily doped.

* * * * *